(12) United States Patent
Gilliland

(10) Patent No.: US 7,544,064 B2
(45) Date of Patent: Jun. 9, 2009

(54) CYCLINDRICAL IMPEDANCE MATCHING CONNECTOR STANDOFF WITH OPTIONAL COMMON MODE FERRITE

(75) Inventor: Don Alan Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/460,345

(22) Filed: Jul. 27, 2006

(65) Prior Publication Data

US 2008/0032522 A1    Feb. 7, 2008

(51) Int. Cl.
H05K 1/14    (2006.01)
(52) U.S. Cl. .......................... 439/74; 361/804; 439/912
(58) Field of Classification Search ................... 439/74; 174/138 G; 361/742, 758
See application file for complete search history.

(56) References Cited

U.S. PATENT DOCUMENTS

| | | | | |
|---|---|---|---|---|
| 3,148,356 | A * | 9/1964 | Hedden, Jr. .................. | 365/55 |
| 3,596,138 | A * | 7/1971 | Lehrfield .................... | 361/785 |
| 4,516,820 | A * | 5/1985 | Kuzma ....................... | 439/289 |
| 4,734,046 | A * | 3/1988 | McAllister et al. .......... | 439/101 |
| 4,796,079 | A * | 1/1989 | Hettiger ...................... | 174/260 |
| 5,091,826 | A | 2/1992 | Arnett et al. | |
| 5,278,524 | A | 1/1994 | Mullen | |
| 5,281,149 | A * | 1/1994 | Petri ........................... | 439/66 |
| 5,313,017 | A * | 5/1994 | Aldissi ........................ | 174/36 |
| 5,345,366 | A * | 9/1994 | Cheng et al. ................ | 361/785 |
| 5,362,952 | A | 11/1994 | Nair et al. | |
| 5,395,099 | A | 3/1995 | Hall | |
| 5,396,186 | A | 3/1995 | Scheutzow | |
| 5,618,188 | A * | 4/1997 | Gilmore et al. ............... | 439/91 |
| 5,675,302 | A * | 10/1997 | Howard et al. .............. | 333/243 |
| 5,744,948 | A | 4/1998 | Swart | |
| 5,825,633 | A * | 10/1998 | Bujalski et al. ............. | 361/804 |
| 5,964,625 | A | 10/1999 | Farley | |
| 6,019,610 | A * | 2/2000 | Glatts, III ..................... | 439/66 |
| 6,038,140 | A * | 3/2000 | Petri ........................... | 361/804 |
| 6,412,546 | B1 | 7/2002 | Lin et al. | |
| 6,442,045 | B1 | 8/2002 | Goodwin et al. | |
| 6,545,878 | B2 * | 4/2003 | Ribeiro ....................... | 361/804 |
| 6,603,080 | B2 * | 8/2003 | Jensen ........................ | 174/255 |
| 6,609,914 | B2 * | 8/2003 | Dibene, II .................... | 439/74 |
| 6,618,268 | B2 * | 9/2003 | Dibene et al. ............... | 361/787 |
| 6,623,279 | B2 * | 9/2003 | Derian et al. ................. | 439/74 |
| 6,882,247 | B2 * | 4/2005 | Allison et al. ............... | 333/182 |
| 6,972,967 | B2 * | 12/2005 | Norte et al. ................. | 361/818 |
| 7,466,562 | B2 * | 12/2008 | Gilliland et al. ............ | 361/803 |
| 2004/0058566 | A1 | 3/2004 | Ma | |
| 2004/0072467 | A1 * | 4/2004 | Jordan et al. ................ | 439/492 |

* cited by examiner

*Primary Examiner*—Neil Abrams
(74) *Attorney, Agent, or Firm*—Patterson & Associates

(57) ABSTRACT

The present invention generally relates to providing a controlled impedance connection between two PCBs. A connector may connect a first PCB to a second PCB. The connector may comprise of a body made from a dielectric material and a plurality of conductive lines defined in the dielectric material. One or more of the conductive lines may transfer one or more signals between the PCBs. A return path may be provided for each signal line. Furthermore, the width, length, and the proximity of a signal line and its associated return line may be selected to match the impedance of the connector to the impedance of the PCB. The connector may also contain one or more ferrite layers to suppress electromagnetic radiation caused by common mode currents.

19 Claims, 6 Drawing Sheets

CYLINDRICAL IMPEDANCE MATCHING CONNECTOR STANDOFF WITH OPTIONAL COMMON MODE FERRITE

CROSS-REFERENCE TO RELATED APPLICATIONS

This application is related to U.S. patent application Ser. No. 11/458,743, entitled TOOLLESS METHOD FOR ALIGNMENT, RETENTION, CONNECTION, TERMINATION AND TEST ON PRINTED CIRCUIT BOARDS filed Jul. 20, 2006, by Gilliland, et al. This related patent application is herein incorporated by reference in its entirety.

BACKGROUND OF THE INVENTION

1. Field of the Invention

The present invention generally relates to connecting two or more Printed Circuit Boards (PCBs) and more specifically to providing a controlled impedance connection between the two or more PCBs.

2. Description of the Related Art

Most electronic devices today contain one or more Printed Circuit Boards (PCBs). A PCB is used to mechanically support and electrically connect components of a device using conductive pathways called traces. For example, a computer usually contains a PCB called the motherboard. The motherboard contains the essential components of the computer such as the microprocessor and main memory, along with other basic components. The components may be housed in sockets and connected to each other using the traces.

During assembly of electronic devices, one or more PCBs may be secured to a device frame or chassis. Securing the PCBs usually involves fastening the PCB to the device chassis, using screws. The PCB is usually secured on one or more standoffs. Placing the PCB on a standoff ensures airflow along both surfaces of the PCB, thereby allowing cooling during operation of the device. The standoffs also prevent undesired contact between active circuits of the PCB and other device components.

Furthermore, one or more PCBs may be connected to each another to facilitate communication between the PCBs. Connecting two or more PCBs may involve providing a connector to connect circuits on the PCBs. Typically, the connectors include individual conductive paths housed in a plastic body. At one end of the conductive path a first pin coupled with the conductive path may be configured to connect to a connector pad or trace line of a first PCB. At the other end of the conductive path a second pin coupled with the conductive path may be configured to connect to a connector pad or trace line of a second PCB, thereby establishing an electrical connection between the first and second PCBs. One problem with prior art connectors is that the connectors typically provide for planar connection of the PCBs, thereby taking up valuable space in a device.

Another problem with prior art connectors is that the impedance of a conductive line in a connector may not match the impedance of a circuit on the PCB. Such impedance mismatches result in undesired reflection of signals transferred between PCBs at the interface of a circuit of a PCB and the connector. Reflections can distort the signal transferred between the PCBs and result in transmission failures. Furthermore, in order to prevent transmission errors caused by signal reflection, the speed at which PCB circuits operate may have to be limited. With growing demand for increasingly faster devices, the limitations imposed by the connectors can become unacceptable.

Another problem with prior art connectors is that the connectors may carry significant common mode currents. Such common mode currents are a primary source of electromagnetic radiation in a device. Electromagnetic radiation may interfere with the operation of circuits in the device and adversely affect the reliability of electronic systems.

Therefore, what is needed are methods, systems, and articles of manufacture for providing a controlled impedance connection between PCBs.

SUMMARY OF THE INVENTION

The present invention generally relates to connecting two or more Printed Circuit Boards (PCBs) and more specifically to providing a controlled impedance connection between the two or more PCBs.

One embodiment of the invention provides a connector comprising a dielectric body comprising at least one first conductive path and a second conductive path associated with each first conductive path, the first conductive path and second conductive path being formed in the body, wherein the first conductive path is configured to transfer a signal from a first Printed Circuit Board (PCB) to a second PCB and the second conductive path associated with the first conductive path provides a return path for the signal.

Another embodiment of the invention provides a method for electrically connecting PCBs. The method generally comprises placing a connector between a first PCB and a second PCB, the connector comprising a dielectric body comprising at least one first conductive path and a second conductive path associated with each first conductive path, the first conductive path and second conductive path being formed in the body, and transferring a signal through the first conductive path from the first PCB to the second PCB, wherein the second conductive path associated with the first conductive path provides a return path for the signal.

Yet another embodiment of the invention provides a system generally comprising a first PCB, a second PCB, and at least one connector for electrically connecting the first PCB and the second PCB. The connector generally comprises a body made from a dielectric material, the body comprising at least one first conductive path and a second conductive path associated with each first conductive path, the first conductive path and second conductive path being formed in the body, wherein the first conductive path is configured to transfer a signal from the first PCB to the second PCB and the second conductive path associated with the first conductive path provides a return path for the signal.

A further embodiment of the invention provides a connector generally comprising a dielectric body comprising at least one first conductive path and a second conductive path associated with each first conductive path, the first conductive path and second conductive path being formed in the body, wherein the first conductive path is configured to transfer a signal from a first Printed Circuit Board (PCB) to a second PCB and the second conductive path associated with the first conductive path provides a return path for the signal. The connector further comprises a first surface for coupling the connector with the first PCB, wherein coupling comprises electrically connecting at least one of the first conductive elements and the associated second conductive elements to the first PCB, a second surface for coupling the connector with the second PCB, wherein coupling comprises electrically connecting the at least one of the first conductive elements and the second conductive elements to the second PCB, and a third surface for receiving a standoff mechanically coupling the first PCB with the second PCB.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention generally relates to providing a controlled impedance connection between two PCBs. A connector may connect a first PCB to a second PCB. The connector may comprise of a body made from a dielectric material and a plurality of conductive lines defined in the dielectric material. One or more of the conductive lines may transfer one or more signals between the PCBs. A return path may be provided for each signal line. Furthermore, the width, length, and the proximity of a signal line and its associated return line may be selected to match the impedance of the connector to the impedance of the PCB. The connector may also contain one or more ferrite layers to suppress electromagnetic radiation caused by common mode currents.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Figure 1:
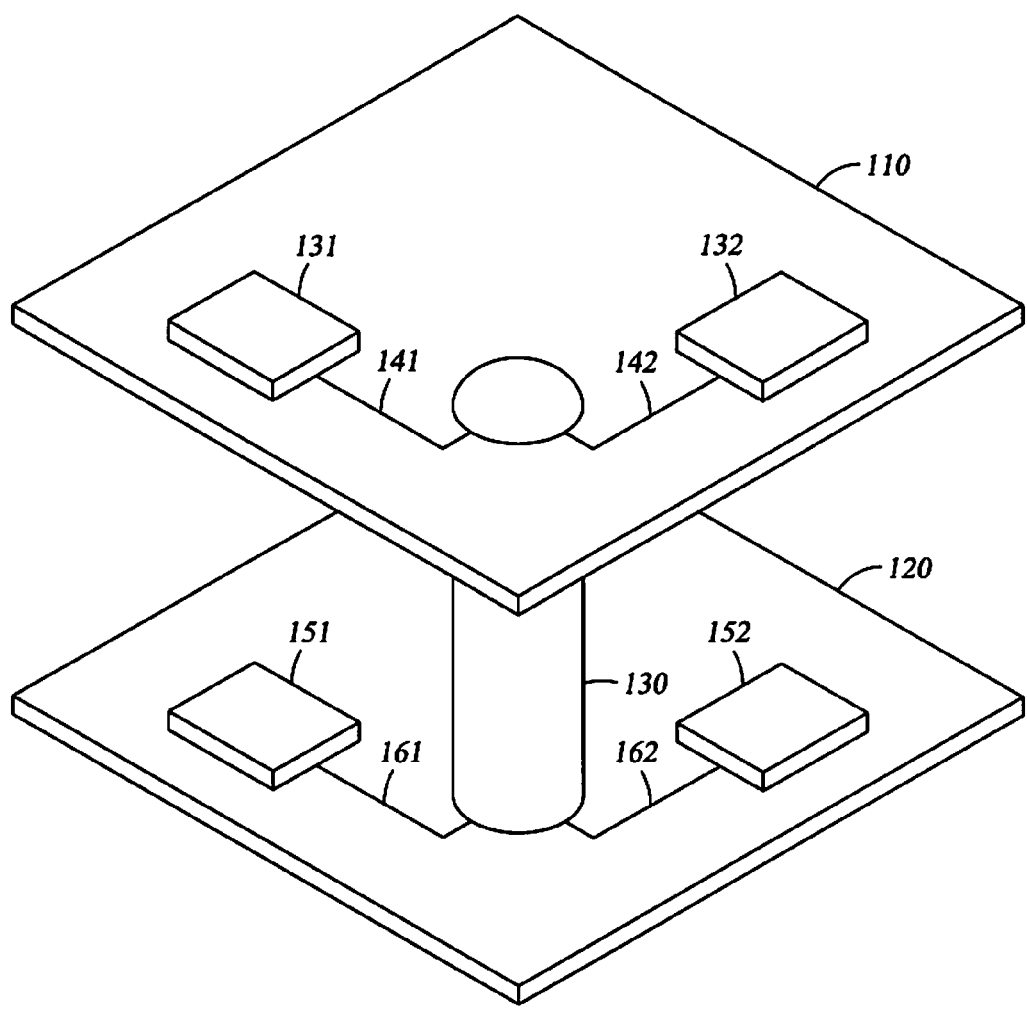
FIG. 1 illustrates an exemplary system in which embodiments of the invention may be implemented.

FIG. 1 is an illustration of an exemplary system 100 in which embodiments of the invention may be implemented. As illustrated in FIG. 1, system 100 may include one or more Printed Circuit Boards (PCBs). For example, two printed circuit boards 110 and 120 are shown. Each PCB may contain one or more circuits, for example, PCB 110 is shown with circuits 131 and 132. Likewise, PCB 120 includes circuits 151 and 152.

The PCBs, for example, PCB 110 and PCB 120, may be connected to each other using one or more connectors 130. Each connector 130 may be configured to provide an electrical connection between a first PCB and a second PCB. The electrical connections may connect one or more circuits on the first PCB, for example PCB 110, to one or more circuits on a second PCB, for example PCB 120.

Accordingly, one or more traces may carry a signal from the circuits on the PCBs to a connector 130. For example, in FIG. 1, trace 141 connects circuit 131 to connector 130, trace 142 connects circuit 132 to connector 130, trace 151 connects circuit 161 to connector 130, and trace 152 connects circuit 162 to connector 130 in FIG. 1. For purposes of simplicity a single trace line is shown connecting a circuit to connector 130 in FIG. 1. However, one skilled in the art will recognize that multiple signal lines may carry signals from a respective circuit to a connector 130.

Connector 130 may transfer the signals received from a circuit on a first PCB to a circuit on a second PCB. For example, in FIG. 1, connector 130 may transfer one or more signals from circuit 131 of PCB 110 to circuit 151 of PCB 120. Similarly connector 130 may transfer one or more signals from circuit 132 of PCB 110 to circuit 152 of PCB 120. More generally, connector 130 may be configured to transfer one or more signals from one or more circuits on a first PCB to one or more circuits on a second PCB.

One advantage of the embodiment illustrated in FIG. 1 is that PCBs need not be connected in the same plane. By allowing stacking of the PCBs, valuable space may be saved, thereby allowing the construction of smaller devices. In some embodiments, the connector may be cylindrically shaped, thereby allowing smooth airflow in the region between the PCBs for cooling.

Furthermore, connectors 130 may provide a mechanical support to hold a first PCB above a second PCB, as shown in FIG. 1. For example, in some embodiments, a connector 130 may provide a connection between a first PCB and a second PCB, and also act as a standoff to support the first PCB on top of the second PCB.

In one embodiment, connector 130 may be configured to receive one or more signals from a standoff cap. The signals from the standoff cap may be transferred directly to the second PCB through connector 130. For example, during testing, test signals may be directly transferred to a second PCB, underneath the first PCB, without dismantling the device. Therefore, the risk of damage to device components may be greatly reduced.

Figure 2:
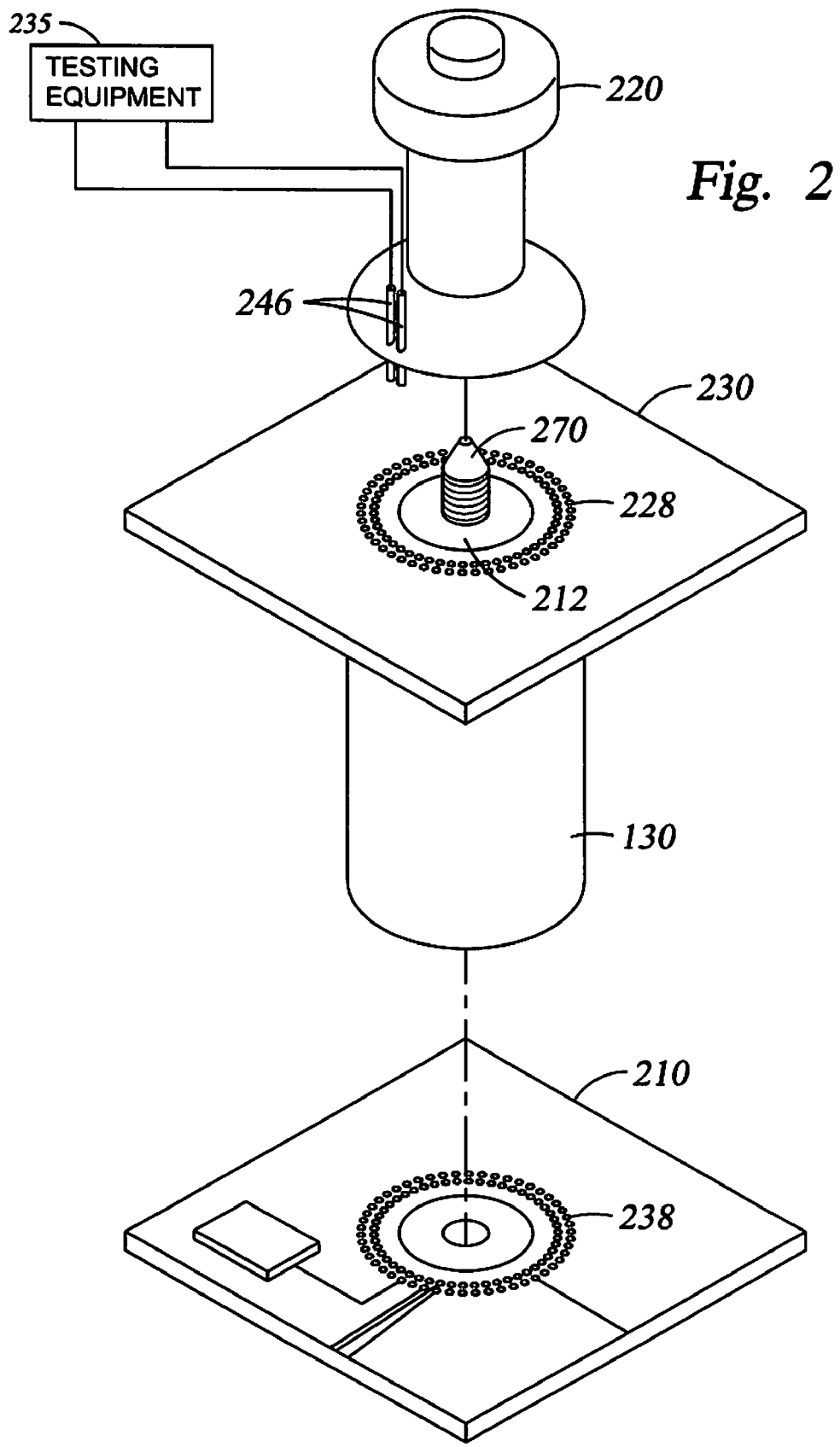
FIG. 2 illustrates an exemplary system according to an embodiment of the invention comprising a standoff cap and a connector configured to receive signals from the standoff cap.
Figure 3A:
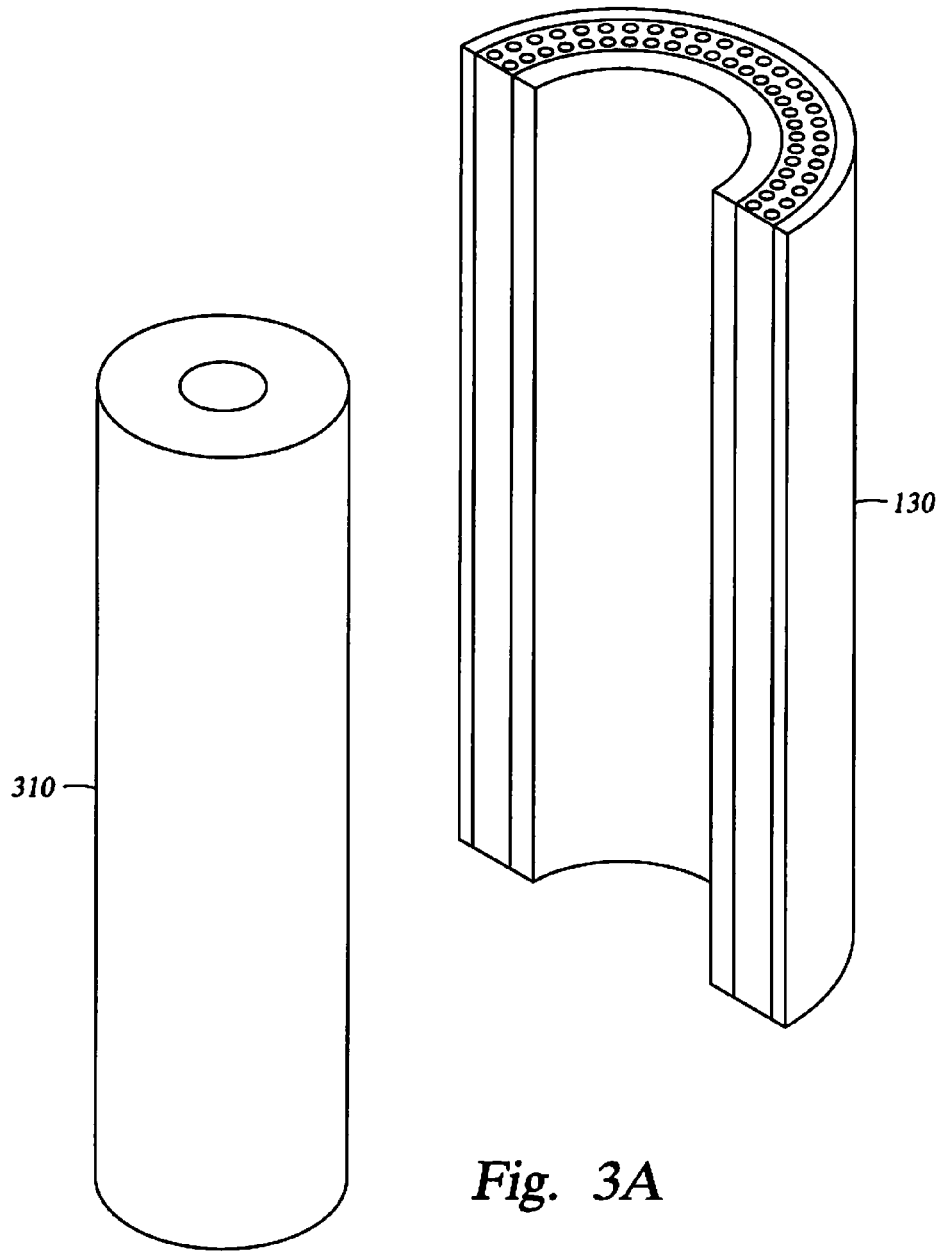
FIGS. 3A and 3B illustrate a detachable connector, according to an embodiment of the invention.
Figure 3B:
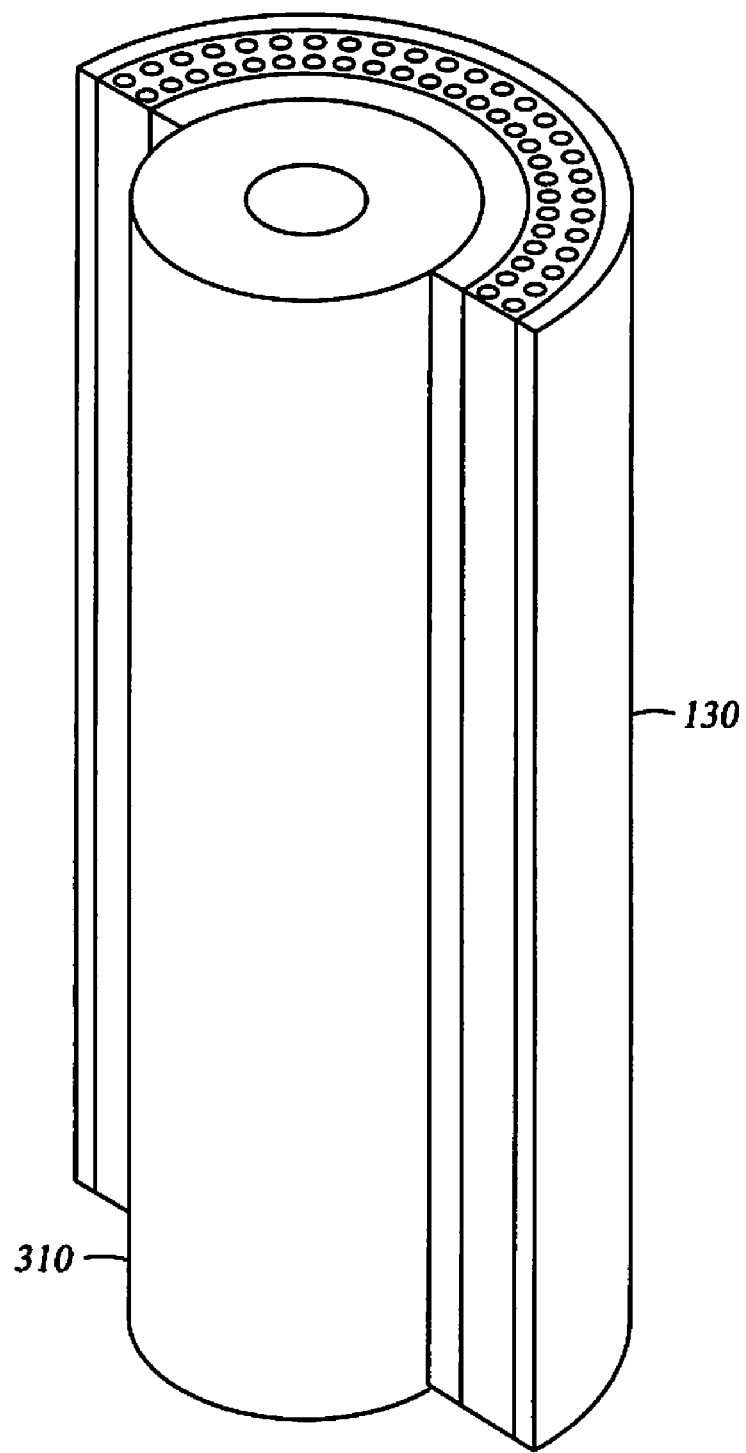

FIG. 2 is an illustration of an embodiment of the invention wherein connector 130 is configured to transfer one or more signals from a standoff cap to a PCB. Connector 130 may be configured to couple with the body of a standoff, for example standoff 310 in FIG. 3B. While a semi-circular connector is illustrated in FIG. 3B, one skilled in the art will recognize that connector 130 may be of any reasonable shape configured to couple with a desired surface of standoff 310. For example, in one embodiment, connector 310 may be cylindrical and configured to completely wrap around standoff 310. Furthermore, while cylindrical shaped connectors are disclosed herein by way of example, one skilled in the art will recognize that connector 130 is not limited to a cylindrical shape. Any appropriate shape of connector 130 may be implemented. For example, in one embodiment, connector 130 may be a rectangular shaped connector.

Referring back to FIG. 2, a standoff may include a securing member 270. Securing member 270 may be passed through an aperture 212 on PCB 230. A standoff cap 220 may be placed on a portion of the securing member 270 that protrudes from aperture 212 to secure PCB 230 to connector 130. Illustratively, the portion of the securing member 270 that protrudes from aperture 212 is threaded, so that it is contemplated that the protruding portion may be threadingly engaged with a counter-threaded bore formed in the standoff cap 220.

Standoff cap 220 may be coupled with one or more test cables 246. Test cables 246 may be coupled with testing equipment 235 at one end and to the standoff cap 220 at the other end, as illustrated in FIG. 2. Standoff cap 220, when secured to the securing member, may transfer the test signals from the test cables to connector 130 through one or more contact pads 228. For example, test signals may be transferred from the test cables to a contact pad 228 by fastening standoff cap 220 to a securing element 270.

Connector 130 may transfer the signals received at contact pad 228 to one or more contact pads 238 of PCB 210. Each contact pad 238 may be electrically coupled with a trace leading to a circuit on PCB 210, as illustrated in FIG. 2. Therefore, test signals may be transferred from the standoff cap to PCB 210 without detaching PCB 210 and PCB 230.

In one embodiment of the invention, connector 130 may be detachable from a standoff, thereby allowing the reuse of connectors on different PCBs. FIGS. 3A and 3B illustrate a detachable connector according to an embodiment of the invention. As illustrated in FIGS. 3A and 3B connector 130 may have a semi circular configuration. Connector 130 may be adapted to be juxtaposed in relation to a standoff and electrically connect two PCBs. Therefore, connector 130 may be installed and removed from the standoff.

In one embodiment, two semi circular connectors 130, for example connector 130 illustrated in FIGS. 3A and 3B, may couple with each other around standoff 310 to completely encompass standoff 310. For example, two semicircular connectors 130 may be coupled with each other using hinges, such that in an open configuration, the connectors may receive the standoff, and in a closed configuration, the connectors may be coupled with the standoff. Alternatively, the connectors may also include recesses and protrusions that allow the connectors to couple with one another around a standoff.

Figure 5:
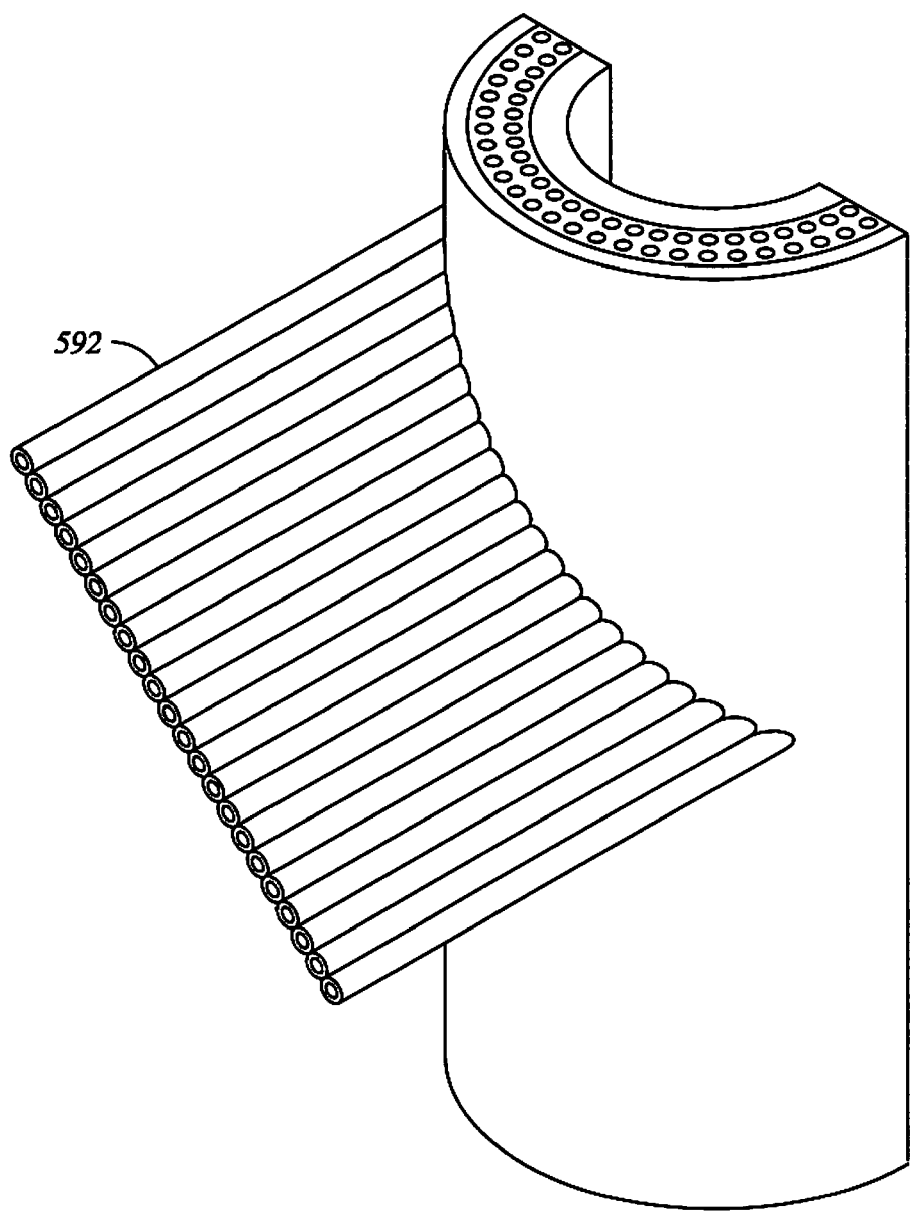
FIG. 5 is an illustration of a connector configured to receive signals from one or more cables.

In some embodiments, one or more testing cables may be directly connected to a connector 130. As illustrated in FIG. 5, a plurality of testing cables 592 may be coupled to the side of connector 130 to provide test signals to one or more PCBs through connector 130.

While coupling of the connector 130 with a standoff is disclosed herein, one skilled in the art will recognize that a connector 130 may connect two PCBs without coupling with a standoff. For example, connector 130 may be placed between two PCBs to electrically connect the two PCBs as well as provide mechanical support to couple the two PCBs.

Connector 130 may be configured to provide a controlled impedance connection between the PCBs. Impedance is a measure of passive opposition to the flow of current along a trace. Impedance may consist of resistance, reactance, inductance, and capacitance. The impedance along a connection may depend, for example, on the length of the trace, width of the trace, proximity of other traces, and the like.

Controlling impedance may involve matching the impedance of the connector to the impedance of the traces on the PCBs. One skilled in the art will recognize that when an impedance mismatch is present, a signal on the trace may be reflected, thereby causing distortion of the signal and potential transmission errors. An impedance mismatch may occur, for example, at the interface of a PCB trace and the connector. Therefore, embodiments of the invention provide controlled impedance connections between the PCBs by adjusting the impedance of the connectors.

Figure 4:
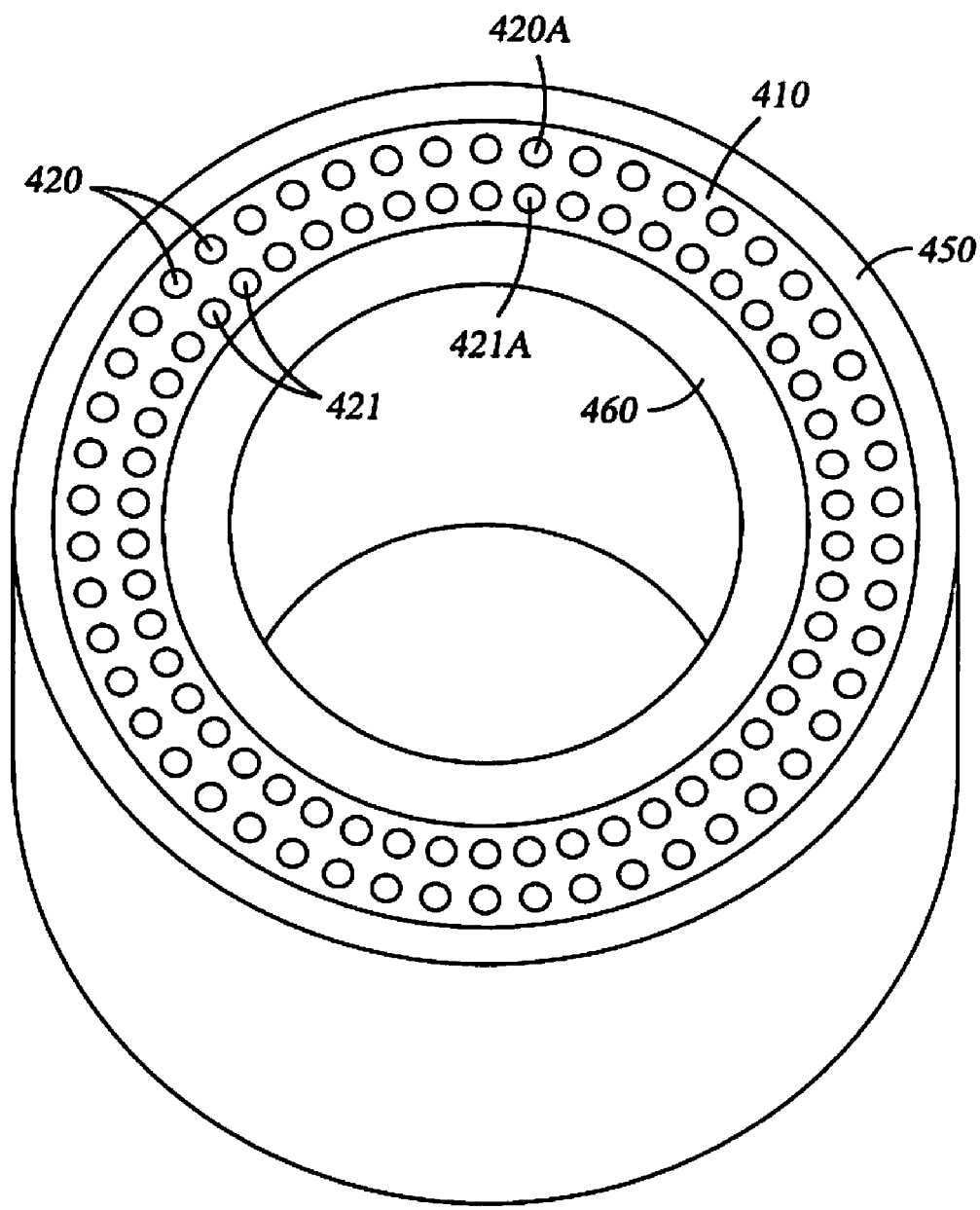
FIG. 4 is a cross sectional view of a connector according to an embodiment of the invention.

FIG. 4 illustrates a cross sectional view of a connector 130. As illustrated, connector 130 may include a body 410 and a first set of conductive elements 420 and a second set of conductive elements 421 disposed in the body. The first set of conductive elements may be defined along the outer perimeter of body 410, and the second set of conductive may be defined along in inner perimeter of body 410, as illustrated in FIG. 4.

Each conductive element in the first set of conductive elements may be configured to carry a signal from a first PCB to a second PCB. Furthermore, each conductive element in the first set of conductive elements may have an associated conductive element in the second set of conductive elements defining a return path for the signal carried by the conductive element in the first set of conductive elements.

Defining a return path for signals transferred from one PCB to another may allow controlling impedance. For example, the length, width of the first conductive elements, and the proximity of each conductive element in the first set of conductive elements to an associated element in the second set of conductive elements defining a return path may be selected such that the impedance of the connector matches the impedance of the traces of the PCBs. To provide controlled impedance, a conductive element from the first set of conductive element and an associated conductive element from the second set of conductive elements defining a return path may be placed in relative proximity to each other according to a desired impedance match. For example, in FIG. 4, conductive element 420A may define a signal path and conductive element 421A may define a return path for signals carried on element 420. As illustrated, elements 420A and 421A are placed in close proximity to each other.

Furthermore, body 410 may be made from a suitable dielectric material to maintain a controlled impedance connection throughout the length of the connector. For example, in one embodiment, body 410 may be made from a Flame Resistant 4 (FR4) material. More generally, any dielectric material capable of reducing losses, providing isolation of the conductive elements, and providing strength and stiffness to house the conductive elements and support the weight of a PCB may be used.

One skilled in the art will recognize that the arrangement of the first set conductive elements and the second set of conductive elements is not limiting on the invention. For example, the first set of conductive elements may be arranged along the inner perimeter of body 410, and the second set of conductive elements may be arranged along the outer perimeter of body 410.

One skilled in the art will also recognize that common mode currents flowing through connector 130 may result in undesired electromagnetic radiation. To prevent such radiation, some embodiments may provide an emission suppressant sleeve made from a suitable ferrite material. The ferrite material may increase the impedance of any common mode currents and therefore control electromagnetic radiation.

For example, referring back to FIG. 4, an outer ferrite layer 450 may be disposed on the outer surface of body 410. Outer ferrite layer 450 may suppress the emission of electromagnetic radiation caused by common mode currents. In some embodiments, an inner ferrite layer 460 may also be provided, as illustrated in FIG. 4. As with outer ferrite layer 450, inner ferrite layer 460 may also suppress electromagnetic radiation caused due to common mode currents in connector 130.

One skilled in the art will recognize that the bulk of the impedance increase for common mode currents may be provided by the outer ferrite core. The inner ferrite core may contribute to the impedance increase and also provide a low reluctance flux path that lowers coupling into the standoff portion of connector 130.

By allowing controlled impedance connections between printed circuit boards, embodiments of the invention ensure efficient communication between the PCBs and the operation of PCB circuits at greater speeds. Furthermore, emissions from common mode currents are reduced thereby preventing device failure due to the emissions.

While the foregoing is directed to embodiments of the present invention, other and further embodiments of the invention may be devised without departing from the basic scope thereof, and the scope thereof is determined by the claims that follow.

What is claimed is:

1. A connector comprising:
   a monolithic hollow cylindrical dielectric body comprising at least one first conductive path and a second conductive path associated with each first conductive path, each of the at least one first conductive path and second conductive path being formed in the cylindrical dielectric body, wherein each first conductive path is formed a first radial distance from an inner radial surface of the cylindrical dielectric body and each second conductive path is formed a second radial distance from the inner radial surface, the first radial distance being greater than the second radial distance, wherein the first conductive path is configured to transfer a signal from a first Printed Circuit Board (PCB) to a second PCB and the second conductive path associated with the first conductive path provides a return path for the signal;
   a first ferrite layer disposed on the inner radial surface of the body; and
   a second ferrite layer disposed on an outer radial surface of the body, wherein the first ferrite layer and second ferrite layer are configured to suppress electromagnetic radiation from the connector.

2. The connector of claim 1, wherein the dielectric body is made from Flame Resistant 4 (FR4) material.

3. The connector of claim 1, wherein the width and the length of the first conductive path and second conductive path are configured to set the impedance of the connector at or near the impedance of the first PCB and the second PCB.

4. The connector of claim 1, wherein the dielectric body is made from a dielectric material selected to maintain controlled impedance throughout the length of the connector.

5. The connector of claim 1, wherein the connector is configured to releasably attach to a standoff mechanically connecting the first PCB and the second PCB and provide an electrical connection between the first PCB and the second PCB.

6. A method for electrically connecting PCBs, comprising:
   placing a connector between a first PCB and a second PCB, the connector comprising:
      a monolithic hollow cylindrical dielectric body comprising at least one first conductive path and a second conductive path associated with each first conductive path, each of the first conductive path and the second conductive path being formed in the dielectric body, the first conductive path being formed a first radial distance from an inner radial surface of the dielectric body and the second conductive path being formed a second radial distance from the inner radial surface of the dielectric body, the first radial distance being greater than the second radial distance;
      a first ferrite layer disposed on the inner radial surface of the body; and
      a second ferrite layer disposed on an outer radial surface of the body,
      wherein the first ferrite layer and second ferrite layer are configured to suppress electromagnetic radiation from the connector; and
   transferring a signal through the first conductive path from the first PCB to the second PCB, wherein the second conductive path associated with the first conductive path provides a return path for the signal.

7. The method of claim 6, wherein the dielectric body is made from Flame Resistant 4 (FR4) material.

8. The method of claim 6, wherein the width and the length of the first conductive path and second conductive path are configured to set the impedance of the connector at or near the impedance of the first PCB and the second PCB.

9. The method of claim 6, wherein the dielectric body is made from a dielectric material selected to maintain controlled impedance throughout the length of the connector.

10. A system, comprising:
    a first PCB;
    a second PCB; and
    at least one connector for electrically connecting the first PCB and the second PCB, wherein the connector comprises:
       a monolithic hollow cylindrical body made from a dielectric material, the body comprising at least one first conductive path and a second conductive path associated with each first conductive path, each of the at least one first conductive path and second conductive path being formed in the cylindrical dielectric body, wherein each first conductive path is formed a first radial distance from an inner radial surface of the cylindrical dielectric body and each second conductive path is formed a second radial distance from the inner radial surface, the first radial distance being greater than the second radial distance, wherein the first conductive path is configured to transfer a signal from the first PCB to the second PCB and the second conductive path associated with the first conductive path provides a return path for the signal;
       a first ferrite layer disposed on the inner radial surface of the body; and
       a second ferrite layer disposed on an outer radial surface of the body,
    wherein the first ferrite layer and second ferrite layer are configured to suppress electromagnetic radiation from the connector.

11. The system of claim 10, further comprising a standoff that mechanically couples the first PCB with the second PCB, wherein the connector is configured to couple with the standoff to connect the first PCB to the second PCB.

12. The system of claim 10, wherein the connector is configured to mechanically couple the first PCB with the second PCB.

13. The system of claim 10, wherein the dielectric material is made from Flame Resistant 4 (FR4) material.

14. The system of claim 10, wherein the width and the length of the first conductive path and second conductive path are configured to set the impedance of the connector at or near the impedance of the first PCB and the second PCB.

15. The system of claim 10, wherein the dielectric material is configured to maintain controlled impedance throughout the length of the connector.

16. The system of claim 10, wherein the first PCB and the second PCB are mechanically coupled with each other by a plurality of standoffs.

17. The system of claim 16, wherein the connector is configured to releasably attach to a standoff and provide an electrical connection between the first PCB and the second PCB.

18. The system of claim 17, further comprising a standoff cap for restraining the first PCB on a standoff, wherein the standoff cap, when coupled with a standoff, is configured transfer one or more signals from one or more cables coupled with the standoff cap to the second PCB through the connector associated with the standoff.

19. A connector, comprising:
a monolithic hollow cylindrical dielectric body comprising at least one first conductive path and a second conductive path associated with each first conductive path, each of the at least one first conductive path and second conductive path being formed in the cylindrical dielectric body, wherein each first conductive path is formed a first radial distance from an inner radial surface of the cylindrical dielectric body and each second conductive path is formed a second radial distance from the inner radial surface, the first radial distance being greater than the second radial distance, wherein the first conductive path is configured to transfer a signal from a first Printed Circuit Board (PCB) to a second PCB and the second conductive path associated with the first conductive path provides a return path for the signal;
a first surface for coupling the connector with the first PCB, wherein coupling comprises electrically connecting at least one of the first conductive elements and the associated second conductive elements to the first PCB; and
a second surface for coupling the connector with the second PCB, wherein coupling comprises electrically connecting the at least one of the first conductive elements and the second conductive elements to the second PCB;
a first ferrite layer disposed on the inner radial surface of the body; and
a second ferrite layer disposed on an outer radial surface of the body, wherein the first ferrite layer and second ferrite layer are configured to suppress electromagnetic radiation from the connector,
wherein the hollow cylindrical dielectric body is configured to receive a standoff that mechanically couples the first PCB with the second PCB.

* * * * *